United States Patent
Dunleavy et al.

(10) Patent No.: US 8,440,121 B2
(45) Date of Patent: May 14, 2013

(54) HIGH-DIELECTRIC MATERIAL

(75) Inventors: Michael Dunleavy, Bristol (GB); Sajad Haq, Bristol (GB); Joseph Maurice Davies, Bristol (GB); Jason Karl Rew, Bristol (GB)

(73) Assignee: MBDA UK Limited, Stevenage, Hertfordshire (GB)

(*) Notice: Subject to any disclaimer, the term of this patent is extended or adjusted under 35 U.S.C. 154(b) by 618 days.

(21) Appl. No.: 12/594,569

(22) PCT Filed: Apr. 4, 2008

(86) PCT No.: PCT/GB2008/001185
§ 371 (c)(1),
(2), (4) Date: Jan. 6, 2010

(87) PCT Pub. No.: WO2008/122775
PCT Pub. Date: Oct. 16, 2008

(65) Prior Publication Data
US 2010/0104839 A1 Apr. 29, 2010

(30) Foreign Application Priority Data
Apr. 4, 2007 (GB) .................................. 0706638.4

(51) Int. Cl.
*C04B 35/00* (2006.01)
(52) U.S. Cl.
USPC ........... 264/104; 264/134; 264/299; 264/308; 264/349
(58) Field of Classification Search .................. 264/104, 264/134, 299, 308, 349
See application file for complete search history.

(56) References Cited

U.S. PATENT DOCUMENTS

| | | | |
|---|---|---|---|
| 5,922,453 A * | 7/1999 | Horn et al. | 428/325 |
| 6,214,445 B1 * | 4/2001 | Kanbe et al. | 428/209 |
| 6,245,845 B1 * | 6/2001 | Miyamori et al. | 524/404 |
| 6,291,054 B1 * | 9/2001 | Thomas et al. | 428/141 |
| 6,525,623 B2 * | 2/2003 | Sridharan et al. | 333/128 |
| 6,528,145 B1 * | 3/2003 | Berger et al. | 428/156 |
| 6,562,448 B1 * | 5/2003 | Chamberlain et al. | 428/312.6 |
| 6,589,639 B2 * | 7/2003 | Farquhar et al. | 428/209 |
| 7,223,807 B2 * | 5/2007 | Okamoto et al. | 524/404 |

(Continued)

FOREIGN PATENT DOCUMENTS

| | | |
|---|---|---|
| EP | 1 790 684 | 5/2007 |
| JP | 03 254011 A | 11/1991 |

(Continued)

OTHER PUBLICATIONS

International Search Report and Written Opinion issued in PCT/GB2008/001185, mailed Jun. 18, 2008.

(Continued)

*Primary Examiner* — Christina Johnson
*Assistant Examiner* — Saeed Huda
(74) *Attorney, Agent, or Firm* — Faegre Baker Daniels LLP (57) ABSTRACT

A bulk dielectric material can include a solid composite material having a solid matrix material and a plurality of filler elements distributed within the matrix material. The bulk dielectric material can have, at a frequency of greater than 1 MHz, (i) a permittivity with a real part of magnitude greater than 10 and an imaginary part of magnitude less than 3, and (ii) an electrical breakdown strength greater than 5 kV/mm and can have a minimum dimension greater than 2 mm.

12 Claims, 7 Drawing Sheets

(b)

U.S. PATENT DOCUMENTS

| | | | |
|---|---|---|---|
| 7,224,122 B2 * | 5/2007 | Yoo | 313/586 |
| 7,314,898 B2 * | 1/2008 | Downing et al. | 524/546 |
| 7,323,666 B2 * | 1/2008 | Spohn et al. | 219/620 |
| 7,745,355 B2 * | 6/2010 | Spohn et al. | 442/289 |
| 8,138,263 B2 * | 3/2012 | Liu et al. | 525/50 |
| 2002/0008599 A1 * | 1/2002 | Sridharan et al. | 333/128 |
| 2002/0187316 A1 * | 12/2002 | Farquhar et al. | 428/209 |
| 2004/0164282 A1 * | 8/2004 | Okamoto et al. | 252/572 |
| 2005/0088096 A1 * | 4/2005 | Yoo | 313/586 |
| 2005/0121437 A1 * | 6/2005 | Spohn et al. | 219/635 |
| 2006/0142468 A1 * | 6/2006 | Downing et al. | 524/544 |
| 2007/0117898 A1 * | 5/2007 | Tan et al. | 524/413 |
| 2008/0124994 A1 * | 5/2008 | Spohn et al. | 442/289 |
| 2009/0170993 A1 * | 7/2009 | Liu et al. | 524/413 |

FOREIGN PATENT DOCUMENTS

| | | |
|---|---|---|
| JP | 05-078165 | 3/1993 |
| JP | 06-279104 | 10/1994 |
| JP | 2003-138067 | 5/2003 |
| WO | WO 01/78085 | 10/2001 |
| WO | WO 2004/034409 | 4/2004 |
| WO | WO 2006/100833 | 9/2006 |

OTHER PUBLICATIONS

Neves, Bob, "Permittivity/Dielectric Constant: Do the Math", *From the Lab, Circuittree Magazine* (US), Nov. 1996, 2 pages.

Search Report issued in GB 0706638, dated Aug. 7, 2007, 3 pages.

* cited by examiner

HIGH-DIELECTRIC MATERIAL

CROSS-REFERENCE TO RELATED APPLICATIONS

The present application is a national phase application of PCT application PCT/GB2008/001185 filed pursuant to 35 U.S.C. §371, which claims priority to GB 0706638.4 filed Apr. 4, 2007. Both applications are incorporated herein by reference in their entirety.

FIELD OF THE INVENTION

This invention relates to high-dielectric materials; more particularly, the invention relates to materials having an electrical permittivity with a high real part and a low imaginary part (i.e. a low loss), and having a high electrical breakdown strength.

BACKGROUND ART

The electrical breakdown strength of a material is the magnitude of electric field required to cause the material to conduct (typically measured as the potential difference at breakdown between two electrodes in contact with opposite sides of a sample of the material, divided by the electrode separation).

Electrical permittivity $\hat{\epsilon}(\omega)$ of a material is defined as:

$$D_0 e^{i\omega t} = \hat{\epsilon}(\omega) E_0 e^{i\omega t}$$

where $E_0$ and $D_0$ are the amplitudes of an electric field and a corresponding displacement field in the material (respectively), $\omega$ is the angular frequency of the fields, t is time, and i is the square root of minus 1. $\hat{\epsilon}(\omega)$ is a complex number: the real part is related to the refractive index seen by electromagnetic waves in the material; the imaginary part is related to the dielectric loss experienced by electromagnetic waves in the material. $\hat{\epsilon}(\omega)$ is also called the frequency-dependent dielectric constant; its dc value (i.e. its value at a frequency of zero) is known as the static dielectric constant. Measuring the magnitude of the permittivity and the loss tangent (for example, by measuring the capacitance and conductance of a parallel-plate capacitor sandwiching the material being tested) enables ready calculation of the real and imaginary parts of the permittivity. The square of the magnitude of the permittivity $|\hat{\epsilon}(\omega)|$ is of course equal to the sum of the squares of the real part $\hat{\epsilon}(\omega)_{real}$ and the imaginary part $\hat{\epsilon}(\omega)_{imag}$ of the permittivity $\hat{\epsilon}(\omega)$, i.e. $\hat{\epsilon}(\omega)_{real}^2 + \hat{\epsilon}(\omega)_{imag}^2$. The loss tangent is the ratio of energy dissipated to energy stored in the dielectric material. The loss tangent equals the imaginary part of the permittivity divided by the real part, i.e.

$$\frac{\hat{\epsilon}(\omega)_{imag}}{\hat{\epsilon}(\omega)_{real}}.$$

Figure 4:
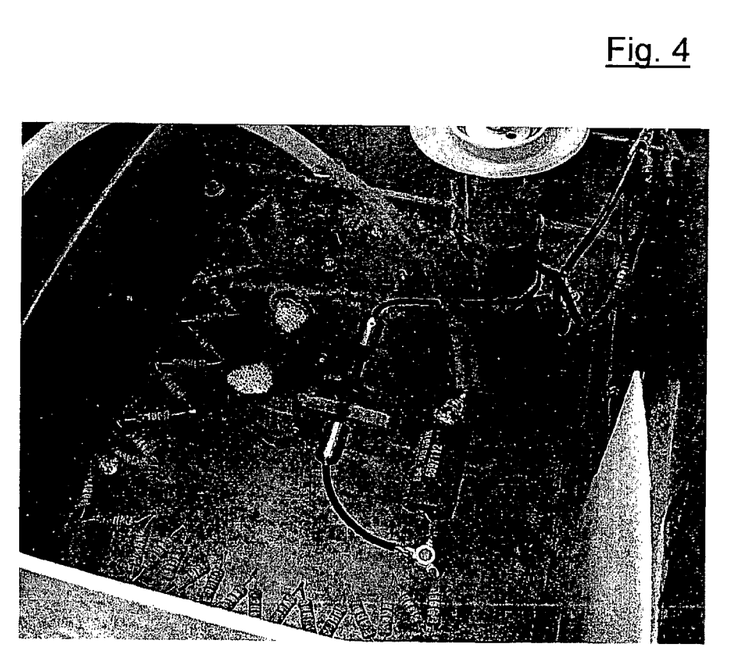
FIG. 4 is apparatus used to test the electrical breakdown strength of the disk of FIG. 3.

In our experiments (described below), we measured, using an Agilent 4285A 75 kHz-30 MHz Precision LCR Meter, the magnitude of the permittivity $|\hat{\epsilon}(\omega)|$ and the loss tangent of samples held in a sample holder similar to that shown in FIG. 4 (though not in an oil bath).

Applications exist for mechanically robust material systems that exhibit high electrical breakdown strength, and have a high dielectric constant, at frequencies ranging from a few MHz to GHz and low dielectric loss. For example, a material with a higher dielectric constant can be made into a device (for example, a lens) that is smaller than a lens with the same properties (e.g. focal length) made from a material with a lower dielectric constant. That is because the electromagnetic "path length" per unit physical length is higher in the higher-dielectric material than in the lower dielectric material; the phase of an electromagnetic wave propagating in the material progresses by a given amount over a shorter distance in the higher-dielectric material.

Most materials that are currently used for applications requiring high dielectric constants are either low-loss ceramics or liquids. Whilst both exhibit reasonable electrical performance, they are not mechanically robust, as sintered ceramics are brittle and liquid mixes can only be used in a limited range of environments and configurations. Also, many high-dielectric-constant materials exhibit high breakdown strength (BDS) when in film form (i.e. when they have thicknesses of a few microns or tens of microns) but when they are in bulk form the BDS is much reduced.

An object of the invention is to provide a dielectric material having dielectric properties similar to or better than prior-art ceramic and liquid dielectric materials and having better mechanical properties than those materials.

DISCLOSURE OF THE INVENTION

In a first aspect, the invention provides a bulk dielectric material having, at a frequency greater than 1 MHz, (i) a permittivity having a real part of magnitude greater than 10 and an imaginary part of magnitude less than 3, and (ii) an electrical breakdown strength greater than 5 kV/mm, the bulk dielectric material being a solid composite material, comprising a solid matrix material and a particulate filler material within the matrix material, and having a minimum dimension greater than 2 mm.

The invention thus provides a bulk material with a dielectric constant, electrical breakdown strength and dielectric loss comparable with or better than prior-art ceramic and liquid high-dielectric materials. Use of a bulk composite material offers improved mechanical properties compared with prior-art materials. For example, liquids (eg glycol, water) need housing but are corrosive to metallic housings and leach plasticisers and impurities from plastic housings; consequently, they have a limited lifetime, and although they need to be of high purity they are easily contaminated. Moreover, leaching or corrosion or any other form of contamination of the liquids leads to impairment of breakdown strength.

The invention also provides an object comprising or consisting of the bulk dielectric material. Some prior-art composite materials achieve high breakdown strengths when in film form, but not in bulk form. The invention provides a bulk dielectric material having a permittivity and breakdown strength that are only achieved in thin film form by prior art materials. The material may be a block, which may be of any shape, including for example a sheet. The material has a minimum dimension greater than 2 mm, that is it is a bulk material measuring greater than 2 mm in all directions. The bulk dielectric material may have a minimum dimension greater than 3 mm, preferably greater than 5 mm, more preferably greater than 10 mm and yet more preferably greater than 20 mm.

Materials according to the invention may have still better electrical properties: the real part of the permittivity may be greater than 15, preferably greater than 20, still more preferably greater than 25 or even greater than 30; the permittivity may have an imaginary part of magnitude less than 2, preferably less than 1, preferably less than 0.8, preferably less than 0.5, still more preferably less than 0.3, less than 0.1, or even less than 0.05; the electrical breakdown strength may be 6.5 kV/mm or more, preferably greater than 10 kV/mm, preferably greater than 15 kV/mm, preferably greater than 20 kV/mm, still more preferably greater than 25 kV/mm, or even greater than 30 kV/mm.

The real part of a material's permittivity generally tends to fall with increasing measurement frequency. The material may have the specified permittivity and electrical breakdown strength at frequencies of less than 100 GHz, less than 75 GHz, less than 40 GHz, less than 30 GHz, less than 20 GHz, or less than 10 GHz. The material may have the specified permittivity and electrical breakdown strength at frequencies of more than 5 MHz, more preferably greater than 10 MHz and yet more preferably greater than 20 MHz.

The breakdown energy density $$U_{breakdown} = \frac{1}{2}\hat{\varepsilon}(\omega)V_{breakdown}^2$$

can be another indicator of the electromagnetic properties of the composite material. It may be that the breakdown energy density, normalised to the breakdown energy density of the filler material, is greater than 1, preferably greater than 1.2, more preferably greater than 1.4, still more preferably greater than 1.6, still more preferably greater than 1.8, or even greater than 2.0.

However, it should be noted that, for some applications, it may not be desirable to have the highest possible real part of the permittivity. For example, a particular application may require the bulk dielectric material to provide a given electromagnetic path length over a fixed physical length; similarly, the bulk dielectric material may be used in a capacitor required to provide a given capacitance with a given plate separation. In those and other cases, it may be that the bulk dielectric material is required to have a real part of its permittivity that is higher than that of prior-art dielectric materials, but not as high as can be achieved; thus, the real part of the permittivity may fall between two of the limits specified above (e.g. between 10 and 15).

Preferably the bulk dielectric material has good mechanical properties. For example, its ultimate strain to failure (i.e. the maximum extension it can withstand before failing, as a percentage of its length) may be greater than 0.5%, preferably greater than 0.6%, more preferably greater than 0.7%, still more preferably greater than 0.8%, or even greater than 0.9%. It may be that before failure it can absorb more than 100 kJ/m$^3$, preferably more than 200 kJ/m$^3$, more preferably more than 300 kJ/m$^3$, still more preferably more than 400 kJ/m$^3$, or even more than 440 kJ/m$^3$.

The matrix material may be an organic resin. The matrix material may be a polymer material (e.g. a silicone). The matrix material may be a homopolymer. The matrix material may be a urethane polymer.

The matrix material may be a thermosetting material. The matrix material may be UV cured.

The matrix material may be a ceramic.

The matrix material may have a lower dielectric constant than the filler material; the filler material may thus have a higher dielectric constant than the matrix material.

The matrix material may have, at a frequency greater than 1 MHz, (i) a permittivity having a real part of magnitude greater than 10 and an imaginary part of magnitude less than 3, and (ii) an electrical breakdown strength greater than 5 kV/mm. The matrix material may have still better electrical properties: the real part of the permittivity may be greater than 15, preferably greater than 20, still more preferably greater than 25 or even greater than 30; the permittivity may have an imaginary part of magnitude less than 2, preferably less than 1, preferably less than 0.8, preferably less than 0.5, still more preferably less than 0.3, less than 0.1, or even less than 0.05; the electrical breakdown strength may be 6.5 kV/mm or more, preferably greater than 10 kV/mm, preferably greater than 15 kV/mm, preferably greater than 20 kV/mm, still more preferably greater than 25 kV/mm, or even greater than 30 kV/mm. The matrix material may have any of the electrical or mechanical properties of the bulk dielectric material listed herein.

The filler material may have, at a frequency greater than 1 MHz, (i) a permittivity having a real part of magnitude greater than 10 and an imaginary part of magnitude less than 3, and (ii) an electrical breakdown strength greater than 5 kV/mm. The filler material may have still better electrical properties: the real part of the permittivity may be greater than 15, preferably greater than 20, still more preferably greater than 25 or even greater than 30; the permittivity may have an imaginary part of magnitude less than 2, preferably less than 1, preferably less than 0.8, preferably less than 0.5, still more preferably less than 0.3, less than 0.1, or even less than 0.05; the electrical breakdown strength may be 6.5 kV/mm or more, preferably greater than 10 kV/mm, preferably greater than 15 kV/mm, preferably greater than 20 kV/mm, still more preferably greater than 25 kV/mm, or even greater than 30 kV/mm. The filler material may have any of the electrical or mechanical properties of the bulk dielectric material listed herein.

The filler material may be solid. The filler material may comprise a ceramic material. The ceramic material may be a titanate, for example SrTiO$_3$. The ceramic material may be a niobate, for example lead magnesium niobate.

The filler material may comprise solid particles. The particles of the filler material may have a diameter of less than 250 microns, less than 200 microns, less than 150 microns, less than 100 microns, or even less than 50 microns. The particles of the filler material may have a generally rounded shape.

Alternatively, the filler material may comprise a fluid. The fluid may be an encapsulated fluid (e.g. a microballoon).

Thus, known high-dielectric material ceramics or fluids—used in bulk in the prior art—may be used as the filler material in example embodiments of the present invention.

The particles of the filler material may comprise a coating. As discussed below, coating the filler material particles can produce significant improvements in electrical and mechanical performance. The coating may be a multilayer coating. The coating may be a modified surface of the filler material particles. The coating may be an organosilicate layer. The coating may be an epoxy layer. The coating may comprise vinyl groups. The coating may be made from a urethane coating. The coating may be derived at least in part from styrene. The coating may be derived at least in part from ethylene. The coating may comprise a metal or metal oxide.

The particles of the filler material may contain pores. The coating material may penetrate into the pores.

It will be understood that a large number of particles of the filler material are distributed throughout the matrix material.

The particles of the filler material may be distributed substantially homogeneously throughout the matrix material. A material with homogenously distributed filler particles may generally be treated as if it were a bulk material having the effective (i.e. net) mechanical and electrical properties produced by the combination of the matrix material and the filler material. Alternatively, the particles of the filler material may be distributed inhomogeneously throughout the matrix material. A material having inhomogeneously distributed filler particles may be a bulk material that displays localised effects (for example localised electromagnetic effects, for example localised focusing or other electromagnetic-field-shaping effects).

The bulk dielectric material may comprise more than 40%, more than 45%, more than 50%, more than 60%, or even more than 65% filler material by volume. The bulk dielectric material may comprise less than 50%, less than 55%, less than 60%, less than 65% or less than 70% filler material by volume. Preferably, the bulk dielectric material comprises 40% to 70% of the filler material by volume. Still more preferably, the bulk dielectric material comprises 50% to 65% filler material by volume.

According to a second aspect of the invention there is provided a method of producing a bulk dielectric material having, at a frequency greater than 1 MHz, (i) a permittivity having a real part of magnitude greater than 10 and an imaginary part of magnitude less than 3, and (ii) an electrical breakdown strength greater than 5 kV/mm, the method comprising the step of forming the bulk dielectric material by distributing a particulate filler material in a matrix material to form a solid composite material, having a minimum dimension greater than 2 mm.

The method may comprise the step of mixing the filler material with the matrix material at a temperature above room temperature.

The method may comprise the step of compressing a mixture of the filler material and the matrix material.

The mixture may be compressed at a pressure of at least 1 GPa. A mixture of the filler material and the matrix material may be placed within a container and the container heated and pressurised (for example, the container may be an autoclave).

A mixture of the filler material and the matrix material may be placed within a container and the container evacuated, for example to infiltrate the matrix material into the filler material.

The matrix material may be a non-thermosetting polymer, and the filler material may be mixed with the polymer.

Alternatively, the matrix material may be a thermosetting polymer, and the filler material may be mixed with the polymer or with a precursor material (e.g. a monomer) that is cured to form the polymer.

Advantageously, the viscosity of the matrix material is sufficiently low to enable effective infiltration of the filler material. Of course, it will be appreciated that the viscosity of the matrix material may be temperature dependent.

Advantageously, the matrix material may have a sufficient 'working life' (i.e. curing time) to allow thorough degassing of the matrix material.

The method may comprise the step of providing the particles of the filler material with a coating. The coating may be a modified surface. The coating may be an organosilicate shell. The coating may be applied by silylation. The coating may be an epoxy shell. The coating may comprise vinyl groups. The particles of the filler material may contain pores and the coating may penetrate into the pores.

The coating may comprise a chemical functionalisation of the particulate surface. The functionalisation may aid the wetting of the resin and improve the homogeneity of the samples.

The method may comprise the step of providing the particles of the filler material with a metal or a metal oxide. For example, the filler particles may be coated with silver, aluminium, or aluminium oxide. Loading the filler particles with a metal or metal oxide in that manner increases the net permittivity of the filler particles. The filler particles may comprise 1% or more, 2% or more, 5% or more, 8% or more, or 10% or more metal or metal oxide, by weight.

The coating may be applied under a vacuum.

The method may comprise building up the bulk dielectric material in a plurality of layers. Each layer may be of a thickness greater than 5 mm, or greater than 10 mm. Each layer may be of a thickness less than 5 mm.

It may be that the bulk dielectric material is in all directions thicker than 3 mm, preferably thicker than 5 mm, more preferably thicker than 10 mm, still more preferably thicker than 15 mm and yet more preferably thicker than 20 mm.

The bulk dielectric material may be a sheet material (but it is not a thin film).

The method may comprise the bulk dielectric material being cast in a mould having a minimum dimension greater than 5 mm. The mould may have a minimum dimension greater than 10 mm, greater than 15 mm or even greater than 20 mm. The casting may occur in a single step; it may be a 'one-shot' casting.

The casting may occur under a vacuum.

According to a third aspect of the invention, there is provided a device comprising a bulk dielectric material according to the first aspect of the invention or a bulk dielectric material made by the method of the second aspect of the invention. The device may utilise an electromagnetic field and the bulk dielectric material may be used to alter the behaviour of the electromagnetic field. It will be understood that the bulk dielectric material will be useful in a wide range of devices; examples include a capacitor, a lens, an oscillator or a transmission line.

According to a fourth aspect of the invention, there is provided use of a bulk dielectric material according to the first aspect of the invention or a bulk dielectric material made by the method of the second aspect of the invention to alter the properties of an electromagnetic field. The electromagnetic field is altered in the sense that at some point in space it takes a different value from that which it would have if the dielectric material were not used. The electromagnetic field may pass through the bulk dielectric material. The use may be use in a device, in which the bulk dielectric material is comprised.

According to a fifth aspect of the invention, there is provided an article consisting of a bulk dielectric material according to the first aspect of the invention. It may be that the article is in all directions thicker than 3 mm, preferably thicker than 5 mm, more preferably thicker than 15 mm and still more preferably thicker than 20 mm.

According to a further aspect of the invention, there is provided a dielectric material having (i) a permittivity measured having a real part of magnitude greater than 10 and an imaginary part of magnitude less than 1, and (ii) an electrical breakdown strength greater than 5 kV/mm, characterised in that the dielectric material is a bulk solid composite material, comprising a solid matrix material and a particulate filler material within the matrix material.

According to a still further aspect of the invention, there is provided a method of producing a dielectric material having (i) a permittivity having a real part of magnitude greater than 10 and an imaginary part of magnitude less than 1, and (ii) an electrical breakdown strength greater than 5 kV/mm, characterised in that the method comprises the steps of forming the dielectric material by distributing a particulate filler material in a matrix material to form a bulk solid composite material.

It will be appreciated that aspects of the present invention described in relation to the method of the present invention are equally applicable to the material of the present invention and vice versa.

BRIEF DESCRIPTION OF THE DRAWINGS

Certain illustrative embodiments of the invention will now be described in detail, by way of example only, with reference to the accompanying drawings, in which.

The manufacturing methods used in our experiments can be divided into three groups. The three groups are described briefly in the next three paragraphs before being described in detail below.

The materials of the first group were fabricated according to a first method (Method A). Materials within this group are not materials according to the present invention.

The materials of the second group were made by a variety of methods (Methods B to E). Materials within this group generally had improved electrical and/or mechanical properties, compared with the materials produced by Method A and materials of the prior art. Materials within this group are examples of materials according to the invention.

The materials of the third group were made by a sixth method (Method C'), which was Method C with an additional silylation step. Materials within this group had still better properties than the materials of the first two groups and are examples of material according to the invention.

Values given herein that vary with electromagnetic frequency are based on measurements made at point frequencies of 75 KHz, 500 KHz, and 1 MHz (the data shown in the accompanying Figures was obtained at 1 MHz). Values were also measured from 1 MHz through to several GHz (about 12 GHz) and the values change by a few percent, (typically 1-5%) over that range.

In our preliminary experiments, we identified a ceramic material, "K200" as a candidate material for use as a particulate filler material in dielectric material according to an example of the invention. The K200 material is a calcium titanate-based proprietary ceramic material, Morgan Electro Ceramic High Voltage capacitor material K200, obtained from Morgan Electro Ceramics, Vauxhall Industrial Estate, Ruabon, Wrexham, LL14 6HY. The K200 ceramic was obtained in both sintered powder form and consolidated block form. The block was ground down to a particulate form using standard techniques.

The K200 material was dispersed in matrix materials that had high breakdown strength, good mechanical properties, low dielectric loss, and offered ease of processing. Specifically, we selected two epoxy-based resin systems, Struers Epofix epoxy Resin (Cat. No. 40200029) and Robnor (PX900D/NC) resin and a siloxane-based material, Dow Corning Sylgard 184 silicone elastomer, for further investigation.

Figure 1:
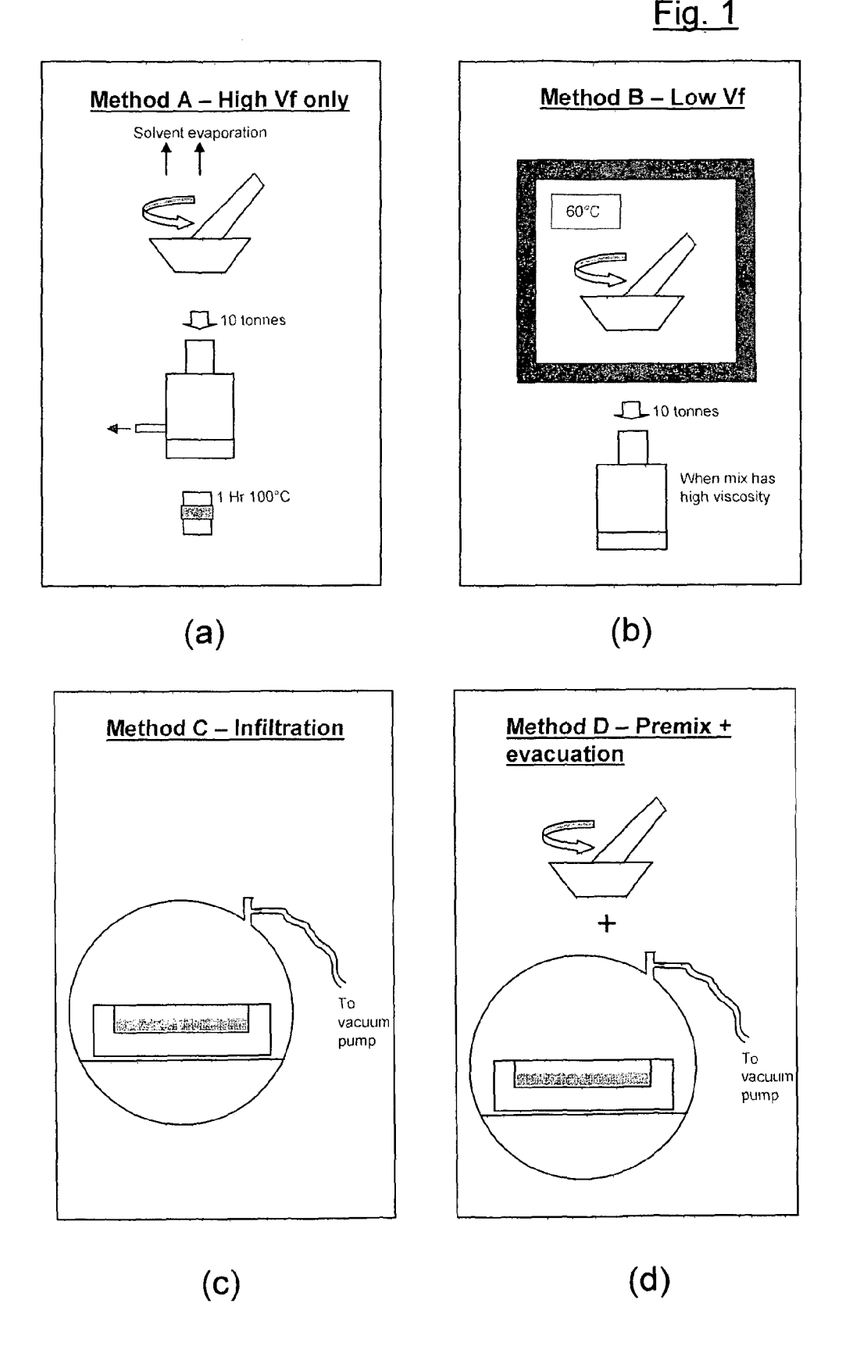
FIG. 1 is (a) a method (Method A) of manufacturing a composite dielectric material and (b) to (e) four methods (Methods B to E) of manufacturing examples of composite materials according to example embodiments of the invention.

In method A (FIG. 1(a)), samples were manufactured by first mixing the K200 particulates with matrix material. The mixture was diluted with a volatile miscible solvent. The solvent was evaporated once good mixing was achieved. The resulting, highly viscous mix was compacted under 1.25 GPa of pressure (that is, 10 tonnes applied to a region of 1 cm diameter) and then cured for one hour at 100 degrees C., in moulds which provided the sample shape required for our electromagnetic measurements. Those measurements showed (FIGS. 5 (a) and (b), data marked with squares) that the K200 material, when dispersed in a polymeric matrix, exhibited reasonably high real permittivity values whilst displaying low imaginary values (i.e., low loss).

Figure 5:
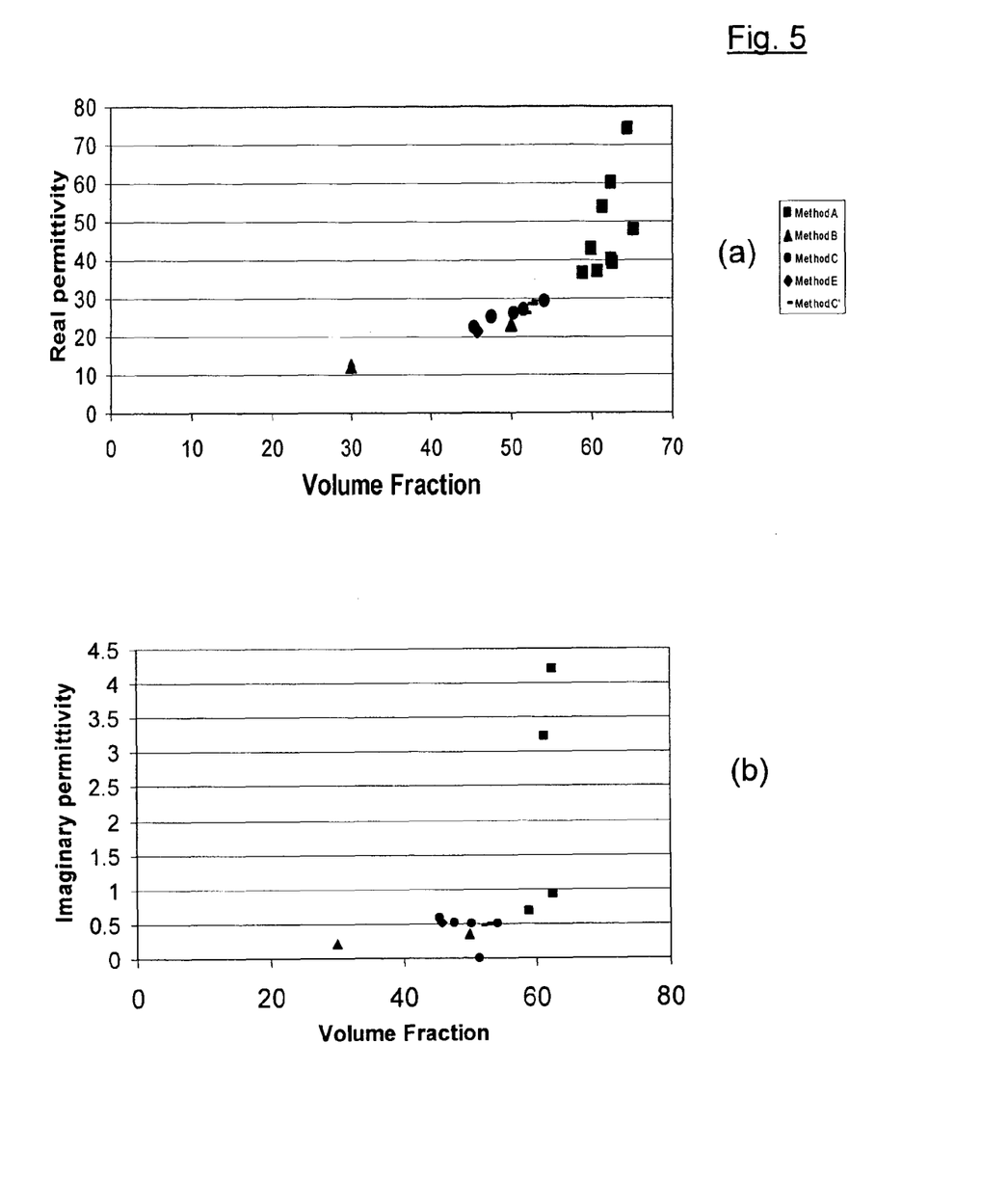
FIG. 5 is a plot of permittivity against volume fraction of filler elements in matrix material for dielectric material made by the methods of FIG. 1, showing (a) the real part and (b) the imaginary part.

The materials exhibited the behaviour one would expect as the volume fraction of filler material increases: the real and imaginary parts of the complex permittivity increased with volume fraction. In order to achieve high dielectric constants (i.e. high real parts of the permittivity), it was necessary to go to high volume fractions, which also meant high losses.

However, we believed that the major reason for the high loss lay in the difficulties involved in preparing high quality samples at high volume fractions. High filler content led to very viscous mixtures and, during the mixing phase, air became entrained. That resulted in the formation of voids, which became more evident at the higher volume fractions, where the mix became more difficult to process.

We developed and investigated a variety of techniques in an effort to ensure good dispersion and homogeneous mixing of the filler material in the matrix systems, whilst reducing the void content. We found that no single method was optimal over the whole range of filler volume fraction that we wished to investigate; thus a range of methods were developed, each of which was best suited to a particular range of volume fraction (VF); the volume fractions preferred for each method were typically     Method A-65-70 vol %
    Method B-0-50 vol %
    Method C-50-65 vol %
    Method D-45-55 vol %
    Method E-60-65 vol %

We expect that those ranges will be widened as our manufacturing techniques improve.

The methods are shown schematically in FIG. 1(b) to (e). A brief description of the methods is given below, together with their limitations.

Method B (FIG. 1(b)) relied on increasing the viscosity of low-volume-fraction systems by thermally initiating gelation of the resin. The increase in viscosity prevented the dense ceramic material from settling out of suspension. The filler material particulates were mixed with the matrix material at 60 degrees C. When the resulting mix became highly viscous, it was compacted under 1.25 GPa of pressure. The material produced by this method had a relatively low VF.

In Method C (FIG. 1(c)) the filler material particulates were placed in a mould and compacted (by hand). Degassed resin and hardener were added. The mixture was then placed in an evacuation chamber. The chamber was pumped (evacuated) to promote resin infiltration of the matrix material. The resulting material had a medium VF.

Method D involved pre-mixing the polymer and ceramic prior to carrying out the steps of Method C (excluding the compaction step).

In Method E, the filler powder was pre-mixed with resin, prior to compaction between frits and then vacuum resin infiltration; high compaction pressures were employed (10 tonnes). The resulting material had medium to high VF.

During the development of these methods attention was given to the need for each of them to be scaled-up, since it was desired that samples large enough for high-voltage testing could ultimately be prepared.

Figure 2:
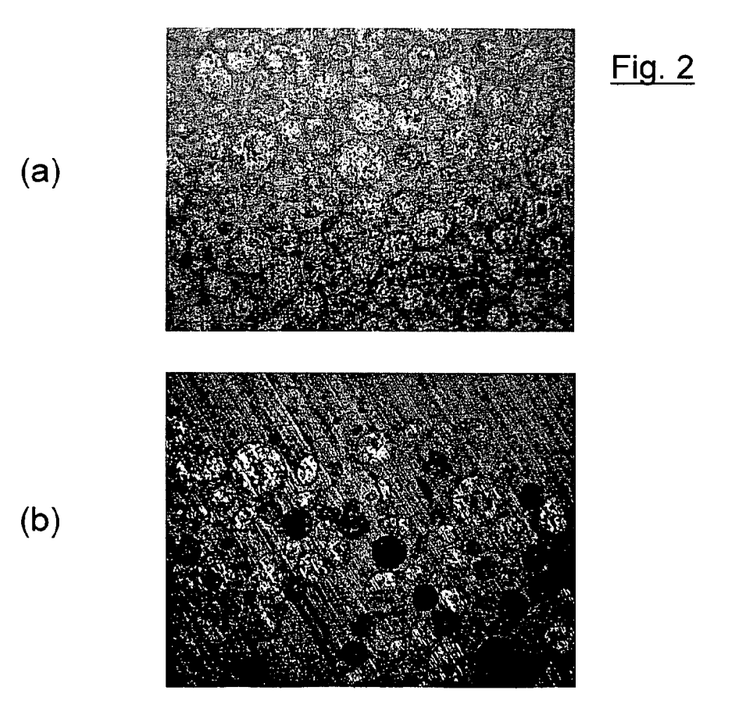
FIG. 2 shows microstructure of (a) a composite material according to an example embodiment of the invention, manufactured by the method shown in FIG. 1(c) (Method C) and (b) a composite material manufactured by the method of FIG. 1(a) (Method A)

FIG. 2 shows optical micrographs of resin-K200 composite materials. FIG. 2(a) shows the excellent dispersion of ceramic in resin that can be achieved using Method C'. In contrast, the initial simple mixing method (method A) resulted in a composite such as that shown in FIG. 2(b), where large voids and resin rich (i.e ceramic free) areas can be seen.

During characterisation of the K200 material we noted that there was a variation of particle size within the bulk. Particles fell into the range of around 50 microns to 200 microns. In order to investigate whether the particle size had any significant influence over the final electromagnetic properties of ceramic/resin composites we elected to fractionate the powder using standard grinding and sieving procedures. The following particle-size fractions were obtained: less than 53 micron, 53 to 90 micron, 90 to 125 micron, 125 to 212 micron, and greater than 212 micron. Composites were prepared and electrically tested. Although there was a variation in the loss values, it was not significant; thus we concluded that, in the range of particle-sizes that we have investigated, the particle size had no significant effect on the permittivity in the case of this specific material system. (However, we did not at this stage investigate silylation or other coating of these particles, which could prevent them from clumping, aggregating or agglomerating.)

Figure 3:
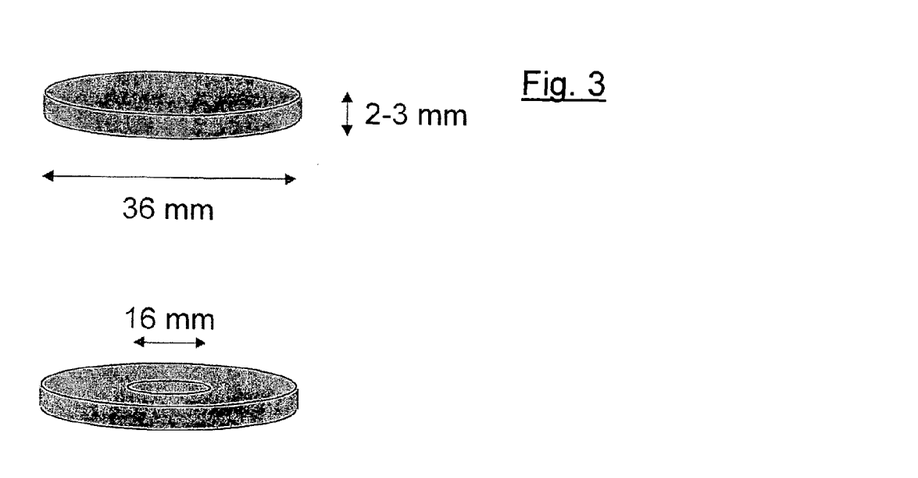
FIG. 3 is an example of a disk of bulk dielectric material according to an example embodiment of the invention, used in testing of the material's electrical breakdown strength.

In order to undertake high-voltage testing, sample discs of composite dielectric material were prepared. The discs had a thickness of 2 mm to 3 mm and were of 36 mm diameter (FIG. 3). The samples were lapped-grinded post-manufacture to ensure that they had flat and parallel surfaces.

Electrodes of 16 mm size were provided on each face. The electrodes had to be centrally located on each face and they had to be vertically aligned. A variety of metals such as silver, gold and gold-palladium alloy were explored; we used silver paste (Acheson silver DAG 1415M) aluminium tape (3M Scotch Brand Aluminium tape 0.09 mm thick), and sputtered gold-palladium using magnetron sputterer. Since the metallization needed to be highly conducting, be well adhered to the substrate, and be compliant in the case of the Sylgard matrix (a flexible substance), we elected to use a screen printing method that deposited the conductor via aligned masks.

A test-rig for the high voltage measurement was purpose built. FIG. 4 shows a sample under test. The high voltage probe, the resistor voltage divider network, and the sample in the oil bath can be seen.

The dielectric properties (at 1 MHz) versus volume fraction of the large-scale samples are plotted in FIG. 5. The plot illustrates that large-area samples with high volume fraction and high values of permittivity were manufactured. It is important to note that high imaginary permittivity values (i.e. high losses) at high volume fractions are again seen in the data of FIG. 5. However the use of methods C and C' (i.e. using degassing and silylation) has allowed reduction of the imaginary permittivity to values less than 1, typically 0.02 in the case of Method C'.

Figure 6:
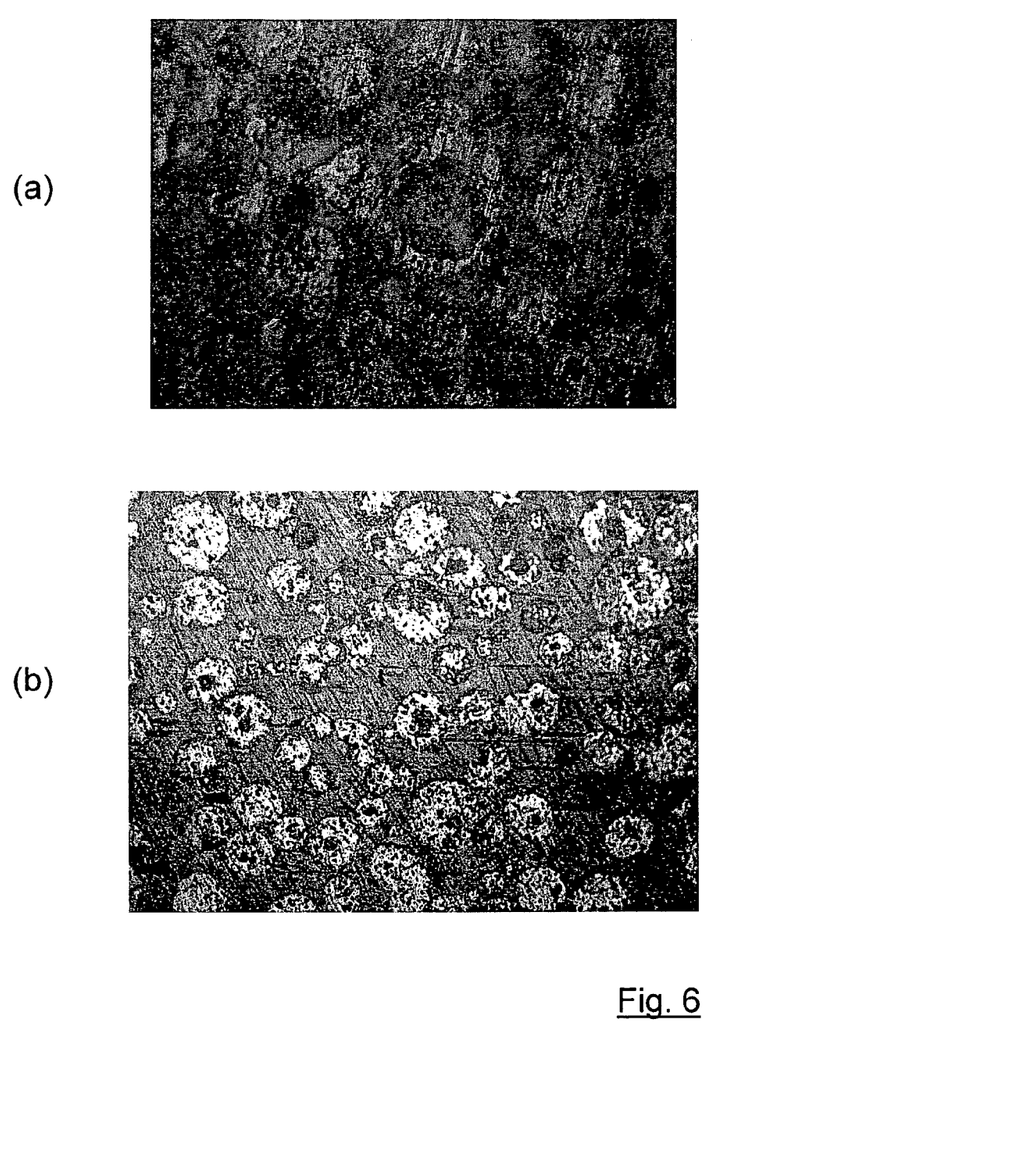
FIG. 6 shows (a) and (b) microstructure of a composite material manufactured by the method of FIG. 1(a)(Method A)

The electrical breakdown strength (BDS) of the samples fabricated by method A was found to be below 5 kV/mm, with values decreasing with increasing permittivity. We believe that the relatively low BDS was a result of voids present in the material, which increase in number at higher VF with the loading of filler (i.e. with increasing permittivity). FIG. 6(a) shows porosity in the samples obtained by method A and we believe that to have been a major contributor to the low BDS we observe. In addition, we also believe that a second mechanism is at least partly responsible for the reduction in BDS with increasing permittivity: that of "percolation" where the particles are in electrical contact. FIG. 6(b) shows a micrograph that illustrates chains of closely connected particles that could lead to percolation-induced electrical breakdown.

We believed at this stage that further improvements in electrical characteristics of the dielectric materials would only be achieved by a major deviation from the approach we were using.

We decided to undertake processing of the base K200 particulates with a view to coating the materials with functional groups. The rationale behind this was to improve the wetting of the K200 to the epoxy moiety; that would then lead to the material being more processable, allowing higher volume fractions to be dispersed within the matrix and higher permittivity values to be achieved. Furthermore the coating would provide electrical isolation between the particles and hence improve the BDS.

We therefore undertook a process of silylation that resulted in the K200 surface being coated with a shell of aminosiloxane terminated with NH2 groups (i.e. the surface is modified). This can be represented schematically as follows:

The NH2 group reacts and bonds to the epoxide group as shown thus:

We prepared samples of this material (in Method C', being method C with the silylation step) and characterised their breakdown strength and permittivity. A detailed description of the method employed is as follows:

Silylation of Titanate Ceramics

K200 titanate ceramic powder (1200 g) was lightly ground using a pestle and mortar in order to break down any aggregates. The powder was added to a mechanically stirred solution of 3-aminopropyltriethoxysilane (100 g) in ethanol (2.5 L) contained in a glass round bottomed three necked flask. The flask was stoppered and the mixture was stirred for a day (~24 h) at room temperature. The mixture was filtered and the collected solid was washed with ethanol (3 times 250 ml) then it was dried in air in a fume extracted cabinet. Finally, the powder was placed in an oven at 110 C for two hours and was then allowed to cool before use.

Note that methanol can be used as a replacement for ethanol without detriment to the reaction. The silylation reaction requires the presence of small quantities of water in order to proceed; however, the reagent grade alcohol used contained sufficient such that no extra water needed to be added. The particle size of the ceramic fell in the range 120 to 200 microns; for smaller particulate material, where the total surface area is greater, more of the silylating agent is required.

We have found that carrying out the silylation process under a vacuum can avoid undesirable porosity.

Epoxide Coating of Aminopropylsilyated Ceramic Powder

Aminopropysilyated K200 powder [as prepared in the preceding example] (30 g) was added to a mechanically stirred solution of the epoxy moiety of bipartite "two pack" EpoFix (from Struers, UK) epoxy resin system (3 g) in dimethylformamide (150 ml). The mixture was stirred for 16 h and the solid was collected and washed successively with dimethylformamide (2 times 50 ml), and chloroform (3 times 50 ml). The powder was allowed to dry in air (fume extracted cabinet) for several hours (typically 6 h).

Method of Manufacture of a Ceramic/Epoxy Composite

Lightly ground (mortar and pestle) ceramic powder (8.4 g) was placed in a cylindrical silicone mould (36 mm diameter and deeper than 1 cm). The powder was lightly compressed into a parallel sided disk shape by application of a stainless steel disc and hand pressure to the top surface. Prepared and degassed (10 min) EpoFix (Struers, UK) resin (3.5 g) was placed on the top surface and the mould was then placed in a vacuum dessicator. The dessicator was gradually evacuated of air and as the pressure within the dessicator reduced the ceramic and the resin began to degas. (Care needs to be taken to ensure that the degassing is not too vigorous or the resin and some ceramic are forced out of the mould.) The degassing was controlled by admission of small amounts of air as needed. After a few minutes the degassing process became less vigorous and the dessicator was evacuated to the best that could be obtained from the vacuum pump (less than 0.05 mm Hg). Total degassing time was 40 minutes, including the initial 10 minute degas of the resin prior to its addition to the mould. The dessicator was vented with air and the mould (together with its content) was transferred to an oven at 1000 and allowed to cure for 1 h. After being allowed to cool, the composite is then ready for machining.

Note that it is possible to allow the resin to cure at lower temperatures; for example 24 h is needed for a full cure at room temperature. Curing the composite at 100 C at elevated pressure (in an autoclave at (typically) 40 psi and as high as 90 psi) furnished a product with a higher dielectric constant and an increased electrical breakdown strength. Autoclaving also suppressed void formation. For large samples (e.g. 60 mm in diameter, 50 mm deep) it is advised that a deep mould (e.g. 100 mm) having an inverted conical section in its upper half (as shown in photo/diagram) is used; that design prevents resin spilling from the mould should the degassing stage become too vigorous.

Figure 7:
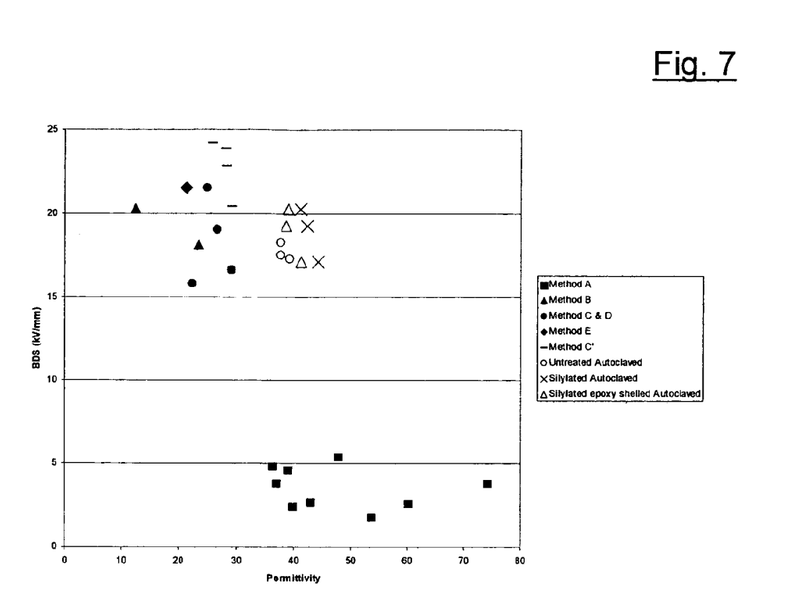
FIG. 7 is a plot against permittivity of breakdown strength in kV/mm for dielectric materials made by the methods of FIG. 1 and by the method of FIG. 1(b), some including an additional silylation step (Method C') and some an additional autoclaving step.

The BDS and permittivity of the materials made by methods A to E and C' are shown in FIG. 7. The silylation has improved the BDS significantly and we now have values of BDS approaching 25 with high permittivity values of close to 30. Also shown in FIG. 7 are results for composite material made by Method C incorporating the additional autoclaving step, composite material made by method C', incorporating the additional autoclaving step, and by method C' with an epoxy shell added to the silylated ceramic particles and also incorporating the additional autoclaving step.

The three sets of data for the methods including autoclaving produced higher permittivities than all any of the other methods, with comparably high break-down strengths. The best results were from Method C'+autoclaving, next were Method C'+epoxy shells+autoclaving, and next Method C+autoclaving.

Basic four point bend mechanical tests were undertaken in order to get a feel for the toughness of the new composite materials. High quality thin rectangular samples (30 mm by 10 mm by 0.6 mm) of the neat K200 ceramic (from block), the non-silylated K200 powder/epoxy composite (made by method C) and the aminosilylated K200 powder/epoxy composite (made by method C') were prepared using standard cutting and lapping techniques and tested using an Instron 4507 universal tension and compression mechanical testing machine.

Figure 8:
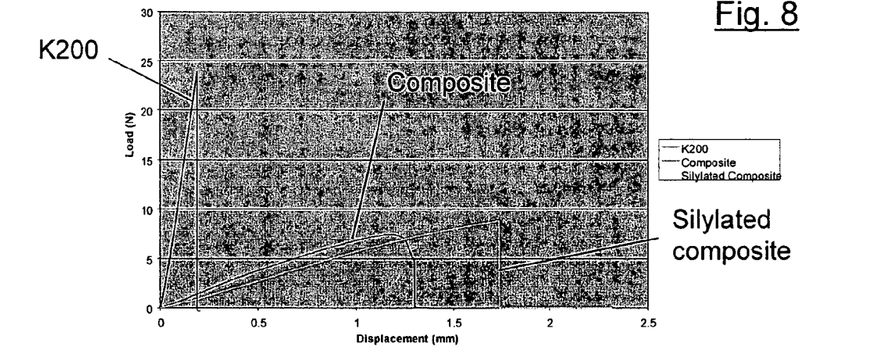
FIG. 8 is a plot of load in Newtons against displacement in mm of samples of pure K200 ceramic, a composite dielectric material made by Method C of FIG. 1, and a composite dielectric material made by Method C'.
Figure 9:
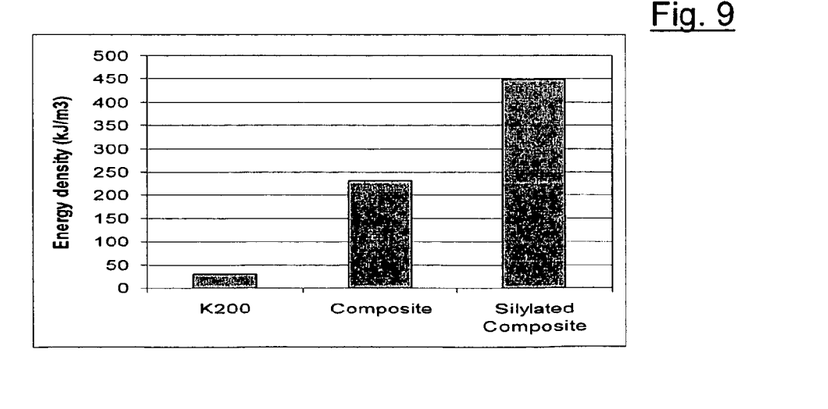
FIG. 9 is a chart showing the absorbed energy density at breakdown, that being the areas under the curves of the plot of FIG. 8.

The results of the 4-point bend tests are summarised in FIG. 8. Although the neat ceramic has a greater ultimate flexural strength, its fracture toughness is much less than that found for the composite samples. The area under the load/displacement curve is a measure of the absorbed energy density (see FIG. 9). FIGS. 8 and 9, and Table 1 below, show that the composite is more deformation tolerant than the ceramic. The material is also more damage tolerant. In addition, the effect of silylating the ceramic powder prior to incorporation into a composite further increases the deformation tolerance of the final body (i.e. the area under the curve in FIG. 8 is increased).

TABLE 1

Mechanical properties determined by a four-point bending test.

| Material | Ultimate strain (to failure) | Energy absorbed per unit volume (to failure) |
|---|---|---|
| K200 ceramic | 0.024% | 30.8 kJ/m$^3$ |
| Composite (made by Method C) | 0.57% | 231 kJ/m$^3$ |
| Silylated composite (made by method C') | 0.94% | 449.1 kJ/m$^3$ |

A simple, qualitative experiment was designed to demonstrate the superior toughness of the ceramic/epoxy composite compared with the neat ceramic material. A test sample (600 microns thick) was placed at the bottom of a vertical plastic pipe that acted as a guide for a stainless steel, spherical weight (6.7 g) that was dropped from the top end of the pipe (1.2 m above the sample).

When the weight struck a neat ceramic sample coupon, the coupon shattered into many pieces. In contrast, when the weight struck the epoxy/ceramic composite sample coupon (made by method C'), the sample did not shatter but remained whole; there was no visual evidence of damage.

The samples we had tested to this point had been bulk samples in the sense of being much thicker than thin-film materials, but had been relatively thin, of the order of 0.6 mm. We next investigated scaling-up the sample thickness in order to provide samples useful in applications requiring such relatively thick samples.

In order to avoid problems with degassing larger samples, we fabricated some thick samples in layers.

51.4 g powder K200 and 18.36 g resin was used in total to make a first, two-layer sample, with each layer consisting of 25.7 g powder and 9.18 g resin. The resin was made in two batches when required, rather than the whole amount being made at once, because the resin deteriorates quickly. For each batch, we made up a small quantity of resin i.e. 12.5 g resin/ 1.5 g hardener, and out of that used 9.18 g, the rest being thrown away.

The resin and hardener were mixed then degassed for 15 minutes.

Half the powder was placed in a mould and compacted by hand, and then half the resin was added. The mixture was degassed for 30 minutes, let to air, and then the excess resin was removed. (Half-way through the second degas the second batch of resin was made up.)

The remaining powder was added and compacted as much as possible, although care was taken to avoid resin left on the surface of the previous layer being squeezed up the sides of the mould onto the top of the new powder. Resin was added. The whole mixture was degassed for 30 mins and cured in the oven at 95 C. Any excess resin was machined/ground off after the curing.

Each layer had a thickness of slightly more than 10 mm thickness; the final thickness when machined was 20 mm. The samples had a 35 mm diameter.

Further samples were produced by the same method but with the curing being in an autoclave at 95 C for 45 minutes under air at a pressure of 50 psi.

Samples that were thicker still (greater than 20 mm) were produced by building up more than two layers.

The powder to resin ratio in each layer was determined by scaling up from the thinner, 3 mm samples. Any excess resin that had not been drawn into the powder after the 30 minute degas was then removed. That was done at each layer, apart from the last layer.

For a six-layer sample, we achieved a thickness of 55 mm total, which was machined to 40 mm. The diameter was 63 mm.

We also manufactured a sample with a metal tube to serve as an electrode. The sample consisted of 6 layers with 50.4 g powder, 18 g resin for each layer, and had a 60 mm diameter.

The thick samples made by the layering method had permittivities and breakdown strengths similar to those of their thinner counterparts. The layered, thick samples were also found to have improved breakdown strength (compared with unlayered, thick samples) under an applied AC voltage (previous tests had used a DC voltage).

We also manufactured thicker samples using 'one-shot' vacuum casting, which allows the fabrication of composite structures without using the layering process described above. In one example, K200 powder was packed into a mould, degassed under vacuum and had a very low viscosity polyeurethane resin poured on top. Subsequent application of pneumatic pressure ensured that the powder was completely wetted and impregnated with resin. The blocks produced had a castellated structure at one end.

In a further example a rod of K200 ceramic/polyurethane composite was successfully produced with length greater than 150 mm and diameter 15 mm.

We also incorporated transition metal chelates into the resin of the composites. Such materials tend to decompose under the conditions of resin cure to furnish polar species that should increase the permittivity. Preliminary results on this approach suggest that the matrix permittivity could be increased by a factor of 3 without adversely affecting the electrical breakdown strength.

Figure 10:
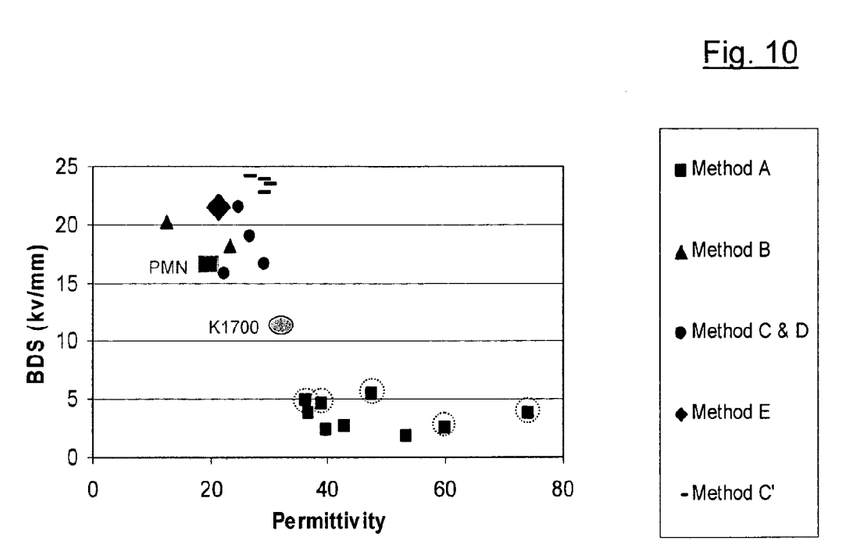
FIG. 10 is the plot of FIG. 7 without results for the autoclaving methods but with additional data, for the breakdown strength and permittivity of lead magnesium niobate and K1700 material.

Initial studies we have undertaken (FIG. 10) on alternative ceramics to K200 have shown that lead magnesium niobate may be a better material. FIG. 10 also shows an early result using Morgan Matroc K1700 material. The K1700 has been milled from a block and added to the matrix in the same manner as the K200.

Typically, higher viscosity resins have a higher permittivity. Further examples of materials that may be used as the matrix material include DR001 Rigid Polyurethane or DR014 Casting Rigid Polyurathane (both available from Atlas Polymers Limited, Units 13-15 Cambrian Industrial Estate, Coedcae lane, Llantrisant, CF72 9EW, UK), or EPO-NAN-YA, NPER-032 or EPO-NAN-YA, NPEL-128 (both products of Nan Ya Plastics Corporation, Taiwan, and obtainable from Whyte Chemicals Limited, Marlborough House, 298 Regents Park Road, Finchley, London, N3 2UA).

The Nan Ya products NPER-032 and NPEL-128 are each an epoxy moiety of a bipartite resin system; thus a hardener is required in order to obtain a cured resin system. We used an amine hardener, EpoFix amine hardener, but other hardeners would be suitable, including other diamines, triamines and anhydrides. In one example, 25 g of NPEL-128 was mixed with 3 g of EpoFix hardener. After de-gassing for 30 min. the resin was cured for 1 h at 100 C.

NPEL-128 is a very viscous liquid whereas NPER-032 has a low viscosity. Whilst each can be used individually, the best quality and best performing ceramic composites are prepared from mixtures of the two resins together with a hardener. In one example, a mixture of 12.5 g of NPEL-128, 12.5 g of NPER-032 and 3 g of EpoFix amine hardener was used to impregnate 8.4 g of K200 ceramic powder.

We have thus demonstrated several complementary methods that provide low loss, high dielectric constant materials with high electrical breakdown strength and mechanical integrity. Through an understanding of some of the mechanisms that contribute to the electrical strength and loss features, e.g. percolation, homogeneity, voids, etc. we have been able to design a material system that demonstrates breakdown strength at least 3 times greater than the analogous K200 ceramic and almost approaching the breakdown strength of the host resin. We have demonstrated that composites are fourteen times more deformation tolerant (i.e. energy absorbing) than bulk ceramic, have significantly enhanced fracture toughness, and have strain to failure improvement of 40 times.

In still further experiments, we have recently achieved still better results. Samples made using method C using K1700 ceramic and K3500 ceramic (in an epoxy resin matrix) gave the following values:—

| MATERIAL | Modulus Permittivity | Loss Tangent | Breakdown Strength (kV/mm) | Re | Im |
|---|---|---|---|---|---|
| K1700/epoxy | 83.65 | 0.022 | 10.6 | 83.62 | 1.84 |
| K1700/epoxy | 85.07 | 0.023 | 15.4 | 85.04 | 1.96 |

| MATERIAL | Modulus Permittivity | Loss Tangent | Breakdown Strength (kV/mm) | Re | Im |
|---|---|---|---|---|---|
| K3500/epoxy | 120 | 0.025 | 6.5 | 119.96 | 2.99 |
| K3500/epoxy | 101 | 0.025 | 10.5 | 100.97 | 2.5 |

We believe that the relatively large difference between the data from samples of the same composition can be explained by the fact that the samples were prepared from block form and crushed using a mortal and pestle for 30 minutes and that, in this preliminary experiment, we made no attempt to fine grind the particles or separate the particles by sizing or the like.

Various methods have been described above for producing a dielectric material according to the invention. The methods are summarised in Table 2. Table 3 summarises the properties of the example dielectric materials produced by each example method.

Of course, in the light of knowledge of the invention, many other methods of making the dielectric material will suggest themselves to the skilled person. Similarly, many other materials will suggest themselves for use in the methods. Whilst the present invention has been described and illustrated with reference to particular embodiments, it will be appreciated by those of ordinary skill in the art that the invention lends itself to many different variations not specifically illustrated herein. For that reason, reference should be made to the claims for determining the true scope of the present invention.

TABLE 2

Summary of example methods described herein

| Method | Mixing | Compression | Evacuation to promote resin infiltration | Curing | Silylation | Epoxy shell | Auto-claving |
|---|---|---|---|---|---|---|---|
| A | Filler material mixed with matrix material precursors, diluted with solvent, solvent evaporated. | Mixture compacted at 1.25 GPa | No | 1 hour @100 C. | No | No | No |
| B | As A, but mixing at 60 C. | As A | No | As A | No | No | No |
| C | Filler material compacted, degassed matrix material precursors added. | Filler elements compacted by hand | Yes | At room temp | No | No | No |
| D | Filler material and degassed matrix material precursors mixed. | No | Yes | As C | No | No | No |
| E | Filler material compacted, resin added under compaction and then infiltrated under vacuum | Mixture compacted at 1.25 GPa | Yes | As C | No | No | No |
| C' | As C | As C | Yes | As C | Yes | No | No |
| C + auto-claving | As C | As C | Yes | As per autoclave cycle | No | No | Yes |
| C' + auto-claving | As C | As C | Yes | As per autoclave cycle | Yes | No | Yes |

TABLE 2-continued

Summary of example methods described herein

| Method | Mixing | Compression | Evacuation to promote resin infiltration | Curing | Silylation | Epoxy shell | Auto-claving |
|---|---|---|---|---|---|---|---|
| C' + epoxy shell + auto-claving | As C | — | Yes | As per autoclave cycle | Yes | Yes | Yes |

TABLE 3

Summary of results from the example methods described herein.

| Method | Max real permittivity | Min imaginary permittivity | Max breakdown strength (kV/mm) |
|---|---|---|---|
| A (not an embodiment of the invention) | 53.5 | 3.21 | 3.5 |
| B | 23 | 0.2 | 20.3 |
| C | 26 | 0.5 | 22 |
| D | 25 | 0.5 | 21.5 |
| E | 21 | 0.5 | 21.5 |
| C' | 29 | 0.46 | 24 |
| C + auto-claving | 39 | 0.06 | 18 |
| C' + auto-claving | 45 | 0.66 | None obtained |
| C' + epoxy shell + auto-claving | 41 | 0.62 | 20.2. |
| C' + epoxy shell | 35 | 0.55 | 23.2 |

The invention claimed is:

1. A method of producing a bulk dielectric material having, at a frequency greater than 1 MHz, (i) a permittivity having a real part of magnitude greater than 10 and an imaginary part of magnitude less than 3, and (ii) an electrical breakdown strength greater than 5 kV/mm, the method comprising:

providing particles of a particulate filler material with a coating, wherein the coating is a modified surface and is an organosilicate shell; and forming the bulk dielectric material by distributing the particulate filler material in a matrix material to form a solid composite material, having a minimum dimension greater than 2 mm.

2. The method as claimed in claim 1, further comprising the step of mixing the filler material with the matrix material at a temperature above room temperature.

3. The method as claimed in claim 1, further comprising the step of compressing a mixture of the filler material and the matrix material.

4. The method as claimed in claim 1, wherein the mixture is compressed at a pressure of at least 1 GPa.

5. The method as claimed in claim 1 wherein a mixture of the filler material and the matrix material is placed within a container and the container is evacuated.

6. The method as claimed in claim 1, wherein the coating is applied by silylation.

7. The method as claimed in claim 1, wherein the coating is applied under a vacuum.

8. The method as claimed in claim 1, wherein the particles of the filler material contain pores and the coating penetrates into the pores.

9. The method as claimed in claim 1, wherein the bulk dielectric material is built up in a plurality of layers.

10. The method as claimed in claim 9, wherein each of the layers has a minimum dimension greater than 5 mm.

11. The method as claimed in claims claim 1, wherein the bulk dielectric material is cast in a mould having a minimum dimension greater than 5 mm.

12. The method as claimed in claim 11 wherein the bulk dielectric material is cast in a single step.

* * * * *